United States Patent [19]
Momose et al.

[11] Patent Number: 5,583,363
[45] Date of Patent: Dec. 10, 1996

[54] INVERTER GATE CIRCUIT OF A BI-CMOS STRUCTURE HAVING COMMON LAYERS BETWEEN FETS AND BIPOLAR TRANSISTORS

[75] Inventors: Hiroshi Momose; Takeo Maeda, both of Tokyo; Koji Makita, Hamamatsu, all of Japan

[73] Assignee: Kabushiki Kaisha Toshiba, Japan

[21] Appl. No.: 860,596

[22] Filed: Mar. 30, 1992

Related U.S. Application Data

[63] Continuation of Ser. No. 472,273, Jan. 30, 1990, abandoned.

[30] Foreign Application Priority Data

Jan. 30, 1989 [JP] Japan .................................... 1-20214

[51] Int. Cl.⁶ ............................ H01L 29/76; H01L 29/94; H01L 31/062; H01L 31/113
[52] U.S. Cl. ........................................ 257/378; 257/370
[58] Field of Search ........................ 357/43; 257/370, 257/378

[56] References Cited

U.S. PATENT DOCUMENTS

| | | | |
|---|---|---|---|
| 4,066,917 | 1/1978 | Compton et al. | 307/304 |
| 4,597,827 | 7/1986 | Nishitani | 156/643 |
| 4,783,423 | 11/1988 | Yamauchi | 437/33 |
| 4,819,047 | 4/1989 | Gilfeatla et al. | 357/23.13 |
| 4,862,290 | 8/1989 | Watanabe et al. | 357/42 |

FOREIGN PATENT DOCUMENTS

| | | |
|---|---|---|
| 0226892 | 1/1987 | European Pat. Off. ............... 257/329 |
| 0310797 | 12/1989 | European Pat. Off. ............... 257/329 |
| 266212 | 3/1989 | German Dem. Rep. . |
| 47-18482 | 9/1972 | Japan . |
| 50-261181 | 8/1975 | Japan . |
| 52-26181 | 8/1975 | Japan . |
| 56-152260 | 11/1981 | Japan . |
| 62-174965 | 7/1987 | Japan . |
| 62-200757 | 9/1987 | Japan ........................... 357/23.3 |
| 62-293665 | 12/1987 | Japan . |
| 63-244767 | 12/1988 | Japan . |
| 8300407 | 2/1983 | WIPO . |

OTHER PUBLICATIONS

Muller et al, *Device Electronics for IC's*, pp. 301–303, 1986.
Gaensslen et al, Hybrid IgFET—Bipolar Transistor IBM Tech, vol. 12, #12, 1970, pp. 2327–2328.
Japanese Patent Abstracts, vol. 11, No. 384, Dec. 15, 1987 & JP-A-62 150 760 Jul. 4, 1987.
Japanese Patent Abstracts, vol. 10, No. 170, Jun. 1986 & JP-A-61 020 425 Jan. 29, 1986.
Japanese Patent Abstracts, vol. 12, No. 9, Jan. 12, 1988 & JP-A-62 169 466 Jul. 25, 1987.
IBM Techinal Disclosure Bulitin. vol. 28, No. 8, Jan. 1986, pp. 3558–3561.
Neues Aus Der Technik, No. 2, Apr. 1, 1977 'Speicher Mit Magnetishchen "Bubble–Domanan"', col. 3; figure 5.
"Full–Swing Complementary BiCMOS Logic Circuits", Hyn J. Shin, et al. Proceedings of the 1989 Bipolar Circuits and Technology Meeting IEEE, 89CH2771-4 Paper 8.7 pp. 229–232.

*Primary Examiner*—Stephen Meier
*Attorney, Agent, or Firm*—Banner & Witcoff, Ltd.

[57] ABSTRACT

A semiconductor device comprises a p-type semiconductor substrate, an n-type semiconductor well formed on the substrate and connected to a positive power supply, a p-type semiconductor source formed within the n-type semiconductor well, a p-type semiconductor layer formed within the n-type semiconductor well and having a lower impurity concentration than the p-type semiconductor source, a first gate electrode formed over a region between the p-type semiconductor source and the p-type semiconductor layer through an insulating film, an n-type semiconductor emitter formed over the p-type semiconductor layer within the n-type semiconductor well, a first conductive layer formed over the n-type semiconductor well to connect with said p-type semiconductor source.

1 Claim, 7 Drawing Sheets

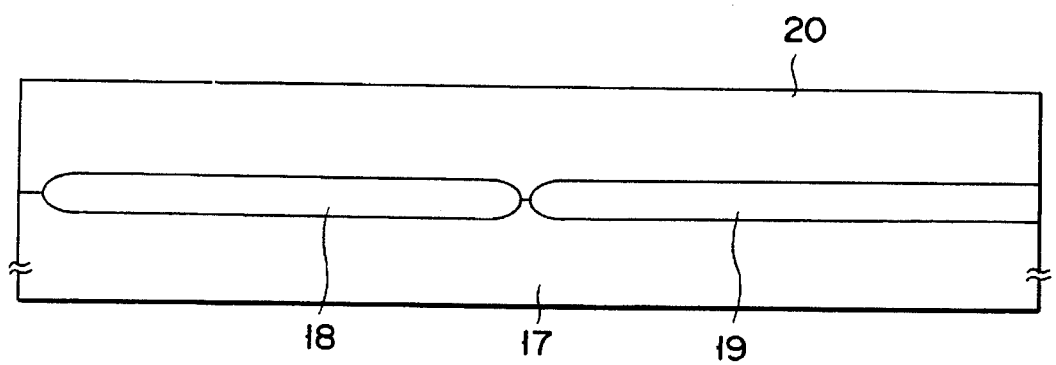
F I G. 3A
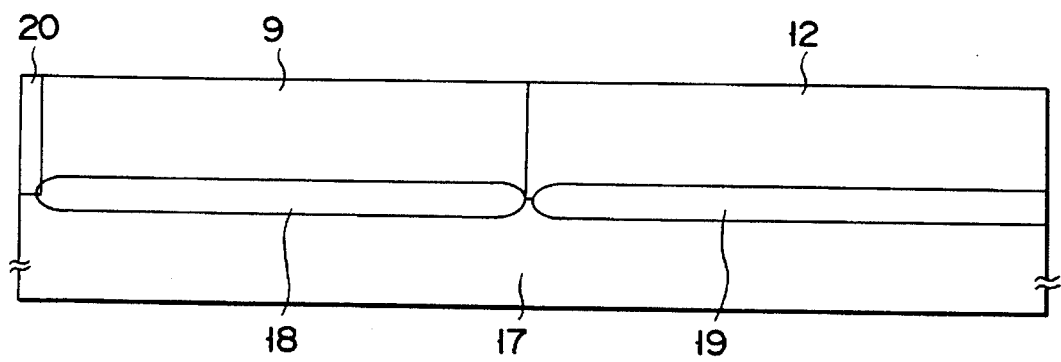
F I G. 3B

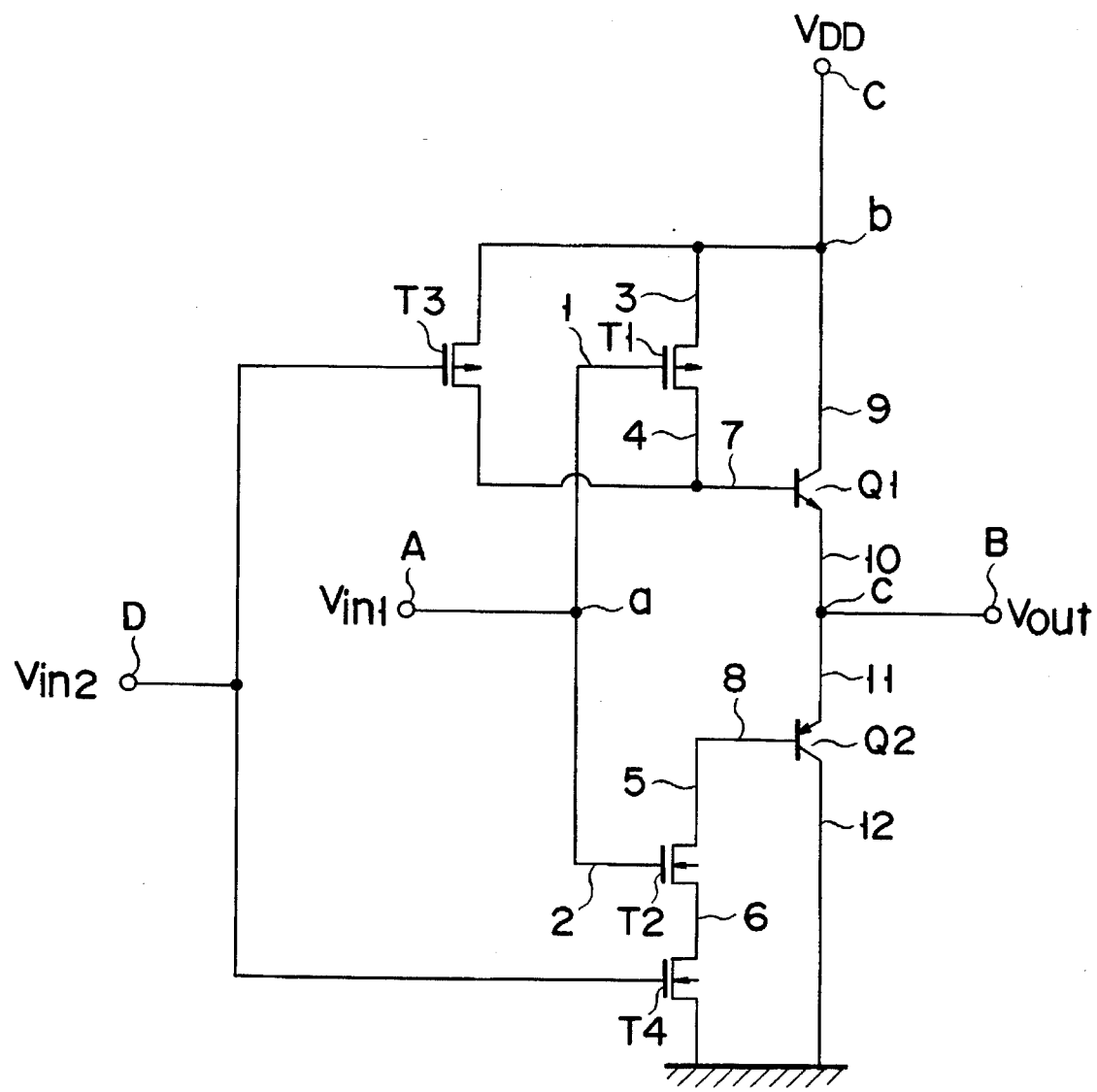
F I G. 5

INVERTER GATE CIRCUIT OF A BI-CMOS STRUCTURE HAVING COMMON LAYERS BETWEEN FETS AND BIPOLAR TRANSISTORS

This application is a continuation of application Ser. No. 07/472,273, filed Jan. 30, 1990, now abandoned.

BACKGROUND OF THE INVENTION

1. Field of the Invention

The present invention relates to a semiconductor integrated circuit and a method of manufacture thereof and, more particularly, to a semiconductor integrated circuit in which npn and pnp bipolar transistors and p- and n-channel MOSFETs are formed together on the same chip and a method of manufacture thereof.

2. Description of the Related Art

Hereinafter, a description is given of a conventional inverter gate circuit of a Bi-CMOS structure which is formed of complementary metal oxide semiconductor field effect transistors (CMOSFETs) and npn bipolar transistors with reference to FIG. 4.

Referring to FIG. 4, there is shown a typical prior art inverter gate circuit formed of CMOS transistors and npn bipolar transistors.

As shown in FIG. 4, the inverter gate circuit is of a totem pole type in which emitter 105 of a load driving npn bipolar transistor Q101 and collector 106 of npn bipolar transistor Q102 are connected together at node d. Npn bipolar transistor Q101 has its base 101 connected to drain 103 of a p-channel MOSFET T101 so as to be driven by MOSFET 101.

Heretofore, each of four transistors T101, T102, Q101 and Q102 constituting the inverter gate circuit is formed within a separate region on a semiconductor substrate. For this reason, the number of regions for isolating transistors from each other increases, thus increasing the occupied area of the inverter gate circuit on the semiconductor chip.

N-channel MOSFET T102 is of a source current supply type and thus susceptible to base potential $V_B$ of npn bipolar transistor Q102 during operation. That is, the effective gate potential of n-channel MOSFET T102 will be given by the difference between input potential Vin of MOSFET T102 and base potential $V_B$ of npn bipolar transistor Q102. This leads to insufficient driving of n-channel MOSFET T102. Where MOSFET T102 is not driven sufficiently, the collector current of npn bipolar transistor Q102 will decrease, making the inverter gate circuit slow in operation. This disadvantage becomes remarkable particularly when a low supply voltage is used. Moreover, because collector 106 of npn bipolar transistor Q102 is connected to node d, the collector potential varies with output levels. For this reason, collector 106 of transistor Q102 must be electrically isolated from other transistors Q101, T101 and T102.

That is, it is desired that npn bipolar transistor Q102 be formed within a n-type well and n-channel MOSFET T102 be formed within a p-type well. For this reason, it is impossible to form bipolar transistor Q102 and MOSFET T102 within the same well. Thus, with the inverter gate circuit of the Bi-CMOS structure it is required to provide a device isolation region between bipolar transistor Q102 and MOSFET T102. This leads to an increase of the occupied area of the inverter gate circuit on a semiconductor chip.

SUMMARY OF THE INVENTION

It is an object of the present invention to provide a semiconductor device which is highly reliable, small in size and operates at high speed.

According to an aspect of the present invention, there is provided a semiconductor device comprising: a p-type semiconductor substrate (17); an n-type semiconductor well (9) formed on said substrate and connected to a positive power supply (VDD); a p-type semiconductor source (3) formed within said n-type semiconductor well (9); a p-type semiconductor layer (201) formed within said n-type semiconductor well (9) and having a lower impurity concentration than said p-type semiconductor source (3); a gate electrode (1) formed over a region between said p-type semiconductor source (3) and said p-type semiconductor layer (201) through an insulating film (48); an n-type semiconductor emitter (10) formed over said p-type semiconductor layer (201) within said n-type semiconductor well (9); a first conductive layer (51) formed over said n-type semiconductor well (9) to connect with said p-type semiconductor source (3); a p-type semiconductor well (12) formed on said p-type semiconductor substrate (7) adjacent to said n-type semiconductor well (9), said p-type semiconductor well being connected to a ground power source (VSS); an n-type semiconductor source (6) formed within said p-type semiconductor well (12); an n-type semiconductor layer (202) formed within said p-type semiconductor well (12) and having a lower impurity concentration than said n-type semiconductor source (6); a gate electrode (2) formed over a region between said n-type semiconductor source (6) and said n-type semiconductor layer (202) through an insulating film (48); a p-type semiconductor emitter (11) formed over said p-type semiconductor well (12); a second conductive layer (51-2) formed over said p-type semiconductor well (12) to connect with said n-type semiconductor source (6); and a third conductive layer (C) connected with said n-type semiconductor emitter (10) and said p-type semiconductor emitter (11).

As can been seen, the semiconductor device of the present invention constitutes a Bi-CMOS circuit. When the present invention is not used, the npn bipolar transistor (Q2) and the n-channel MOSFET (T2) have to be formed within a n-type well and an p-type well, respectively, as described in the Background of the Invention. According to the present invention, however, the second bipolar transistor Q2 is a pnp-type bipolar transistor comprised of an p-type semiconductor well (12), an n-type semiconductor layer (202) and a p-type semiconductor emitter (11) and thus can be formed within the same p-type well as the second MOSFET (T2). In addition, the base of the bipolar transistor and the drain of the second MOSFET (T2) can be formed of the same structure. Thereby, the number of manufacturing steps can be decreased and the device can be made very small.

Furthermore, the p-type semiconductor layer (201) forming the drain of the first MOSFET is formed at an impurity concentration which is lower than that of the p-type semiconductor source (3). The n-type semiconductor layer (202) forming the drain of the second MOSFET is lower in impurity concentration than the n-type semiconductor source (6). In this way, by using a layer of a low impurity concentration on the drain side, a LDD (Lightly Doped Drain) structure can be obtained. This makes an avalanche phenomenon hard to occur within the semiconductor device.

Namely, according to the present invention, two wells have only to be prepared to constitute a Bi-CMOS circuit. This allows the number of manufacturing steps to be decreased and the device to be manufactured in a very small size. In addition, the withstanding property can be improved and a highly reliable semiconductor device can be realized because a LDD type of FET can be made.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A through 3E are sectional views at stages in production of the inverter circuit of FIG. 1;

FIG. 5 is a circuit diagram of a NAND circuit according to the other embodiment of the present invention.

DETAILED DESCRIPTION OF THE PREFERRED EMBODIMENTS

Hereinafter, a semiconductor integrated circuit according to an embodiment of the present invention and a method of manufacture thereof will be described with reference to the accompanying drawings.

Figure 1:
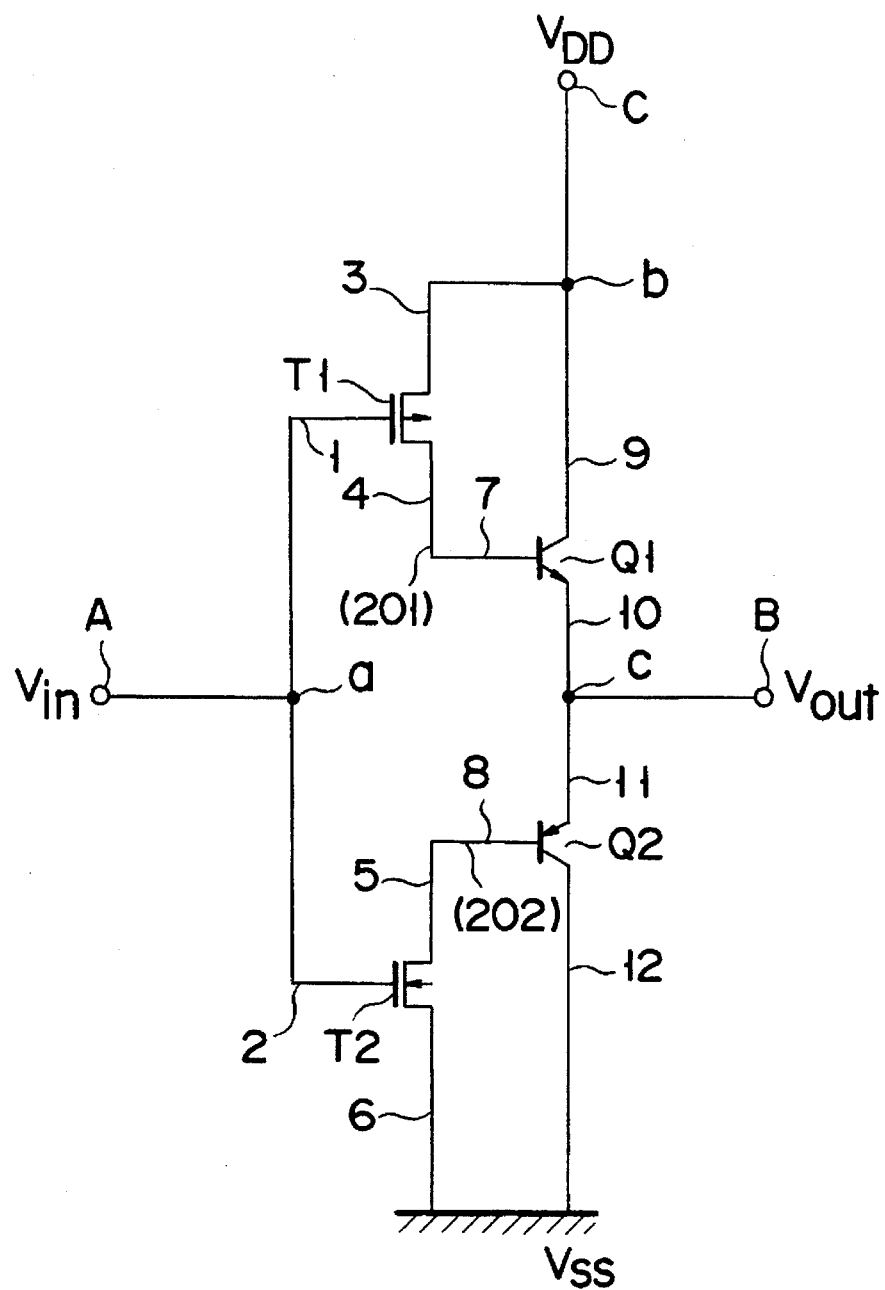
FIG. 1 is a circuit diagram of an inverter circuit according to an embodiment of the present invention.
Figure 2:
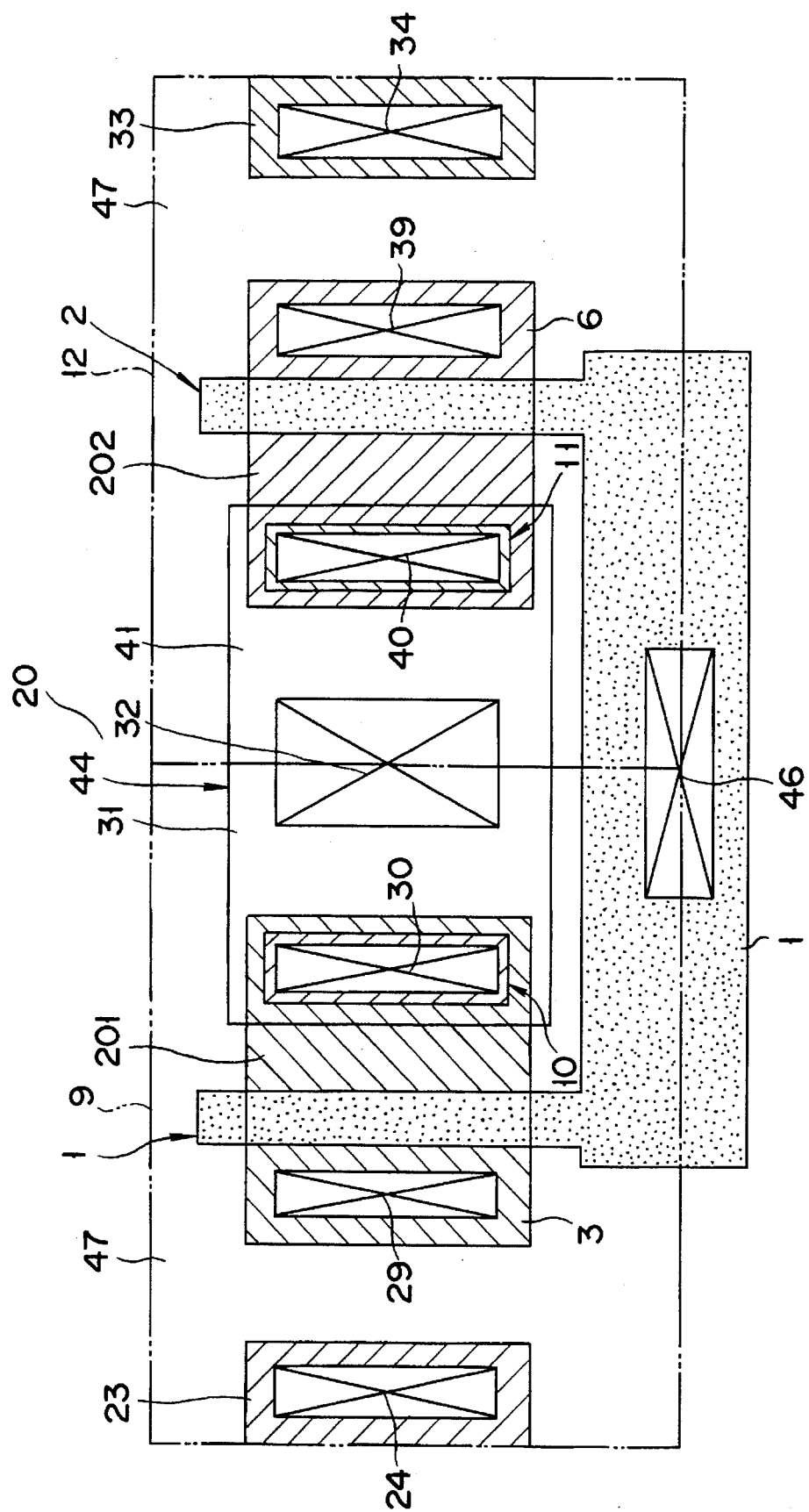
FIG. 2 is a plan view of a semiconductor device constituting the inverter circuit of FIG. 1.

FIG. 1 is a circuit diagram of an inverter gate circuit according to an embodiment of the present invention, FIG. 2 is a plan view of the inverter gate circuit on a semiconductor chip and FIGS. 3A through 3E are sectional views at stages in production of the inverter gate circuit.

In the inverter gate circuit of FIG. 1, an input voltage Vin is applied to an input terminal A which is connected to a node a. Node a is connected to gate 1 of a p-channel MOSFET T1 and gate 2 of an n-channel MOSFET T2. Source 3 of p-channel MOSFET T1 is connected to a node b which is connected to a power supply terminal C supplied with a supply voltage VDD. Drain 4 of p-channel MOSFET T1 is connected to base 7 of an npn bipolar transistor Q1. Source 5 of n-channel MOSFET T2 is connected to base 8 of a pnp bipolar transistor Q2. Drain 6 of MOSFET T2 is connected to ground. Emitter 10 of bipolar transistor Q1 is connected to a node c which is connected to an output terminal B from which an output voltage Vout is derived. Emitter 11 of bipolar transistor Q2 is also connected to node c. Collector 12 of bipolar transistor Q2 is connected to ground.

According to such an inverter gate circuit, source 6 of n-channel MOSFET is directly connected to ground. Therefore, there is no decrease in the effective gate voltage of n-channel MOSFET T2 unlike the art not incorporating the present invention in which the base of an npn bipolar transistor is connected to the source of the n-channel MOSFET. Also, the use of pnp bipolar transistor Q2 in place of the npn transistor used in the prior art permits an inverter action even if the inverter gate circuit is not of a source current supply type. Because the inverter gate circuit of the present invention is not of a source current supply type, the effective gate input potential of n-channel MOSFET T2 becomes the input voltage Vin itself. Thus, it is possible to supply a larger base current to base 8 of pnp bipolar transistor Q2 which is connected to the drain 5 of n-channel MOSFET T2. Hence, pnp bipolar transistor Q2 can be driven by a larger collector current. This allows the inverter gate circuit to be operated at a much higher speed.

With the circuit not incorporating to present invention, there is a need for the collector 106 of npn bipolar transistor Q102 to be electrically isolated from other transistors Q101, T101 and T102 because its collector potential varies with output levels. In other words, npn bipolar transistor Q102 cannot share a collector region of the same conductivity type with npn bipolar transistor Q101. For this reason, there is a problem of need for isolation regions. As shown in FIG. 1, however, the collectors of the pnp and npn bipolar transistors are opposite to each other in conductivity type. This permits pn junction isolation between transistors Q1 and Q2, thus obviating the necessity of provision of an isolation region between Q1 and Q2. Therefore, the inverter gate circuit can be operated at a high speed and formed in a small size.

Furthermore, according to an embodiment of the present invention, to achieve a higher speed in operation and a smaller size of the inverter gate circuit, the layout of the semiconductor device is improved.

Hereinafter, improvements in the layout of the inverter gate circuit will be described with reference to the plan view of FIG. 2 and a method of manufacture of the inverter gate circuit will be described with reference to FIGS. 3A through 3E.

FIG. 2 and FIGS. 3A through 3E illustrate an inverter gate circuit which is improved in the pattern layout on a p-type semiconductor substrate. It is also possible to form the pattern-layout improved inverter gate circuit on an n-type semiconductor substrate.

Constituent elements corresponding to those of the circuit shown in FIG. 1 are designated by like reference numerals.

In FIG. 2, through not shown, a highly doped n+ buried diffusion layer and a highly doped p+ buried diffusion layer are formed on a p-type semiconductor substrate, which are shown in FIGS. 3A through 3E. On the p-type semiconductor substrate is formed a p-type epitaxial layer 20. In p-type epitaxial layer 20, an n-type well region 9 is formed on the highly doped n+ buried diffusion layer not shown in FIG. 2. Likewise, a p-type well region 12 is formed on the highly doped p+ buried diffusion layer not shown in FIG. 2.

A highly doped n+ diffusion layer 23 for assuring collector current flow is formed within n-type well region 9 in such a way to pierce the highly doped n+ buried diffusion layer not shown in FIG. 2. A contact hole 24 is formed in an oxide film (not shown in FIG. 2) formed on highly doped n-type semiconductor layer 23. A collector electrode (not shown in FIG. 2) is formed on highly doped n+ semiconductor layer 23 through contact hole 24. Highly doped n+ semiconductor layer 23, the highly doped n+ buried diffusion layer and part of n well region form the collector region of an npn bipolar transistor. Here the mention of part of n-type well region 9 is based on the ground that a p-channel MOSFET is further formed within n-type well region 9 as will be described later. Moreover, a highly doped p+ source diffusion region 3 is formed within n-type well region 9. A contact hole 29 is formed in an oxide film (not shown in FIG. 2) formed on highly doped source diffusion region 3. A source electrode (not shown in FIG. 2) is formed on highly doped p+ source diffusion layer 3 through contact hole 29. Region 201 serves as the drain diffusion and the base diffusion region in the n-type well 9. The impurity concentration of region 201 has a value that is desirable to the base diffusion region. A contact hole 30 is formed in an oxide film (not shown in FIG. 2) formed on highly doped n+ emitter diffusion region 10. An emitter electrode 31 formed of n-type polysilicon is formed on highly doped n+ emitter diffusion region 10 through contact hole 30.

Emitter electrode 31 is formed integral with an emitter electrode 41 of a pnp bipolar transistor formed within p-type well region 12 as will be described below. That is, the emitter electrode is common to the npn bipolar transistor formed within n-type well region 9 and the pnp bipolar transistor formed within the p-type well region. A contact hole 32 is formed in an oxide film (not shown in FIG. 2) formed on emitter electrode 44. An emitter electrode (not shown in FIG. 2) is formed on emitter electrode 44 through contact hole 32.

On the other hand, within p-type well region 12 is formed a highly doped p+ diffusion region 33 for assuring collector current flow in such a way as to pierce the highly doped p+ buried diffusion region not shown in FIG. 2. A contact hole 34 is formed in an oxide film (not shown in FIG. 2) formed on highly doped p+ semiconductor layer 33. A collector electrode (not shown) is formed on highly doped p+ semiconductor layer 33 through contact hole 34. Highly doped p+ semiconductor layer 33, the highly doped p+ buried semiconductor layer and part of p well region 12 form the collector region of an pnp bipolar transistor.

Here the mention of part of p well region 12 is based on the ground that an n-channel MOSFET is further formed within p-well region 12. Within p-type well region 12 is further formed highly doped n+ source diffusion region 6. In an oxide film (not shown in FIG. 2) formed on highly doped n+ source diffusion region 6 is formed a contact hole 39 through which a source electrode (not shown) is formed on highly doped n+ source source diffusion region 6. Region 202 serves as the drain diffusion and the base diffusion region in the p-type well 12. The impurity concentration of region 202 has a value that is desirable to the base diffusion region.

A highly doped p+ emitter diffusion region 11 is formed within lightly doped n-type base diffusion region 202. A contact hole 40 is formed in an oxide film (not shown in FIG. 2) formed on highly doped p+ emitter diffusion region 11. An emitter electrode 41 formed of p-type polysilicon is formed on highly doped p+ emitter diffusion region 11 through contact hole 40. Emitter electrode 41 is formed integral with emitter electrode 31 formed of n-type polysilicon of the npn bipolar transistor formed within n-type well region 9 as described above. Gate electrode 1 could be common to the p-channel and n-channel MOSFETs.

Common gate electrode 1 is provided with a gate electrode unit 1 of the p-channel MOSFET so that a channel may be formed between source diffusion region 3 and drain diffusion region 201 of the p-channel MOSFET through a gate oxide film not shown. Gate electrode 1 is further provided with a gate electrode unit 2 of the n-channel MOSFET so that a channel may be formed between source diffusion region 6 and drain diffusion region 202 of the n-channel MOSFET through a gate oxide film not shown. A contact hole 46 is formed in an oxide film (not shown) formed on common gate electrode 1 provided with the two gate electrode units. A gate pullout electrode is formed on common gate electrode 1 through contact hole 46.

Region 201 serves as the drain diffusion and the base diffusion region in the n-type well 9. The impurity concentration of region 201 have a value that is desirable to the base diffusion region.

On the other hand, the drain of the n-channel MOSFET and the base of the pnp bipolar transistor are formed integrally with each other within p-type well 12. As described above, because the collector regions of the bipolar transistors are opposite to each other in conductivity type, there is no need for an isolation region, permitting pn junction isolation. The symmetric disposition of corresponding elements formed within two well regions 9 and 12 will allow the emitter electrodes of the npn and pnp bipolar transistors to be formed integrally with each other and the gate electrodes of the p-channel and n-channel MOSFETs to be formed integral with each other at the shortest distance. That is, the shortest wiring between corresponding regions may be made. This permits the device to be formed smaller and the number of contacts to be decreased. Thereby, much higher speed of operation will be achieved and the manufacturing yield will also be improved.

With such a layout as shown in FIG. 2, input terminal A shown in FIG. 1 is connected to the gate electrodes through contact hole 46, output terminal B is connected to emitters 10 and 11 through contact hole 32, and power supply terminal C is connected to the collector 23 through contact hole 24. Power supply terminal C is also connected to source 3 through contact hole 29.

Ground potential Vss is connected to collector 33 through contact hole 34 and to source 6 through contact hole 39. Source 6 of the n-channel MOSFET need not necessarily to be connected to power supply terminal C which collector 23 is connected. That is, distinct from collector 23, source 6 may be connected to a second ground potential of, for example, minus several volts. Such a connecting means can apply a back gate bias to the n-channel MOSFET, reducing capacitance to achieve much higher speed of operation and make improvements in reliability.

Moreover, source 3 of the p-channel MOSFET may be connected to a second ground potential which is plus several volts higher than collector 23. Likewise, much higher speed of operation and improvements in reliability will be achieved.

A description is given below of a method of manufacturing the inverter gate circuit shown in FIG. 2 with reference to FIGS. 3A through 3E. Corresponding parts are designated by like reference numerals in FIGS. 3A through 3E.

First, as shown in FIG. 3A, solid phase diffusion of, for example, antimony (Sb) is made in a predetermined position of p-type semiconductor substrate, thereby to form highly doped n+ buried diffusion layer 18. It is desirable that the surface density be $10^{18}$ to $10^{20}$ cm$^{-3}$ and the sheet resistance be 100 Ω/ or below. Next, ion implantation and thermal diffusion of, for example, boron (B) is made to form highly doped p+ buried diffusion layer 19. At this point the surface density is controlled to $10^{17}$ to $10^{20}$ cm$^{-3}$. Subsequently, p-type epitaxial layer 20 is formed by means of, for example, chemical vapor deposition (CVD). It is desirable that the density of epitaxial layer 20 be $10^{15}$ to $10^{17}$ cm$^{-3}$ and its thickness be 3µ or less.

As shown in FIG. 3B, ion implantation and thermal diffusion are next made to the surface of epitaxial layer 20 so that lightly doped n– well region 9 is formed to overlie highly doped n+ buried diffusion layer 18. Likewise, ion implantation and thermal diffusion are then made to the surface of epitaxial layer 20 to form lightly doped p– well region 12 which overlies highly doped p+ buried diffusion layer 19.

In forming well regions 9 and 12, a period of time of the thermal diffusion step should be as short as possible. This is to prevent deteriorating of precise of n+ buried diffusion layer 18 and p+ buried diffusion layer 19 due to the thermal diffusion. The p-type epitaxial layer 20 may be used instead of forming the p– well region.

Figure 3C:
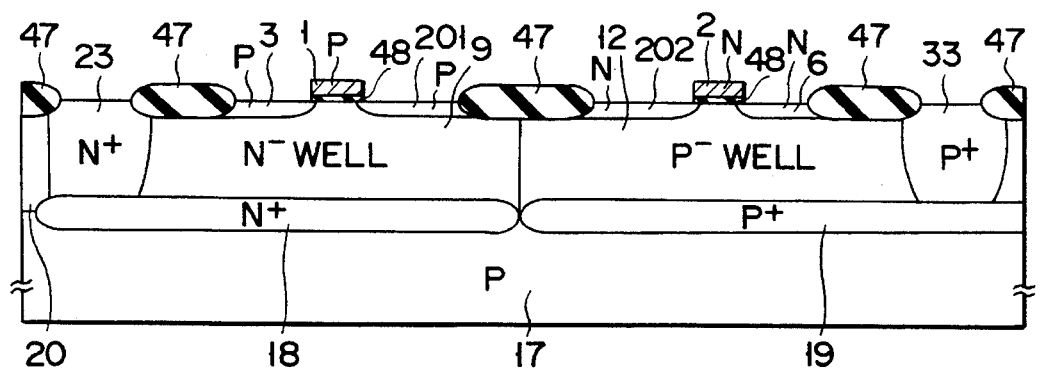

Next, as shown in FIG. 3C, a field oxide layer 47 serving as an element isolation region is formed in a predetermined position of the surface of epitaxial layer 20 by means of, for example, the LOCOS (localized oxidation of silicon) method using selective oxidation. A highly doped N+ type semiconductor layer 23 for facilitating the flow of collector current is subsequently formed in a predetermined position of n– well region 9 in such a way as to pierce n+ buried diffusion layer 18 by means of ion implantation and thermal diffusion. A highly doped p+ type semiconductor layer 33 is subsequently formed in a predetermined position of p– well region 12 in such a way as to pierce p+ buried diffusion layer 19 by means of ion implantation and thermal diffusion. Next, a thin oxide film, which serves as a gate oxide film later, is formed over the entire surface by means of, for example, thermal oxidation. Then, ions are implanted into at least channel regions of the p-channel MOSFET formed in n– well region 9 and the n-channel MOSFET formed in p– well region 12 through the oxide film for controlling the threshold voltages of the MOSFETs. Next, for example, polysilicon, which is a gate material, is deposited over the entire surface by means of, for example, chemical vapor deposition (CVD). The entire surface is then coated with photoresist not shown. The photoresist is developed to a predetermined shape by photoetching method. Using the photoresist as a mask, the polysilicon layer and the thin oxide layer are sequentially etched to form gate electrode 1 and gate oxide film 48 of the p-channel MOSFET and gate electrode 2 and gate oxide film 48 of the n-channel MOSFET. As the gate material, silicide or metal may be used instead of polysilicon.

Next, ions of, for example, arsenic (As) are selectively implanted into a region of p– well region 12 in which the source of the n-channel MOSFET is to be formed, thereby to form source diffusion layer 6. A diffusion layer 202 is selectively formed by means of ion implantation so as to extend over a region in which the drain of the n-channel MOSFET is to be formed and a region in which the base of the pnp bipolar transistor is to be formed. The diffusion layer is shared between the drain of the n-channel MOSFET and the base of the pnp bipolar transistor. Thereby, the number of manufacturing steps can be decreased.

The impurity concentration of region 202 serving as the drain diffusion region and the base diffusion region have a value that is desirable to the base diffusion region. That is, region 202 is formed to have an impurity concentration which is 10 to 100 times lower than that of source region 6 of the n-channel MOSFET. As an example, the impurity concentration of source region 6 is $10^{20}$ cm$^{-3}$ or more and the impurity concentration of region 202 serving as the drain and base is $10^{18}$–$10^{19}$ cm$^{-3}$. By provision of such a difference in impurity concentration between the source and drain, the drain is allowed to take the LDD structure. This can avoid localized concentration of electric field, making the occurrence of avalanche phenomenon difficult. As a result, the withstanding voltage property between the gate and drain and the reliability of the device can be improved.

Next, region 201 serving as the base of transistor Q2 and the drain of transistor T2 is formed by an ion implantation step. The impurity concentration of region 201 is 10 to 100 times lower than that of source region 3. As a result, the withstanding voltage property between the gate and drain is improved and the reliability of the device is enhanced. This is the same as in the case of region 202 serving as the base of transistor Q2 and the drain of transistor T2.

Region 202 serves as the drain diffusion and the base diffusion region in the p-type well 12. The impurity concentration of region 202 has a value that is desirable to the base diffusion region.

Next, ions of, for example, boron (B) or boron fluoride (BF$_2$) are selectively implanted into predetermined source and drain regions of the p-channel MOSFET within n– well region 9, thereby forming source diffusion region 3.

Region 201 serves as the drain diffusion and the base diffusion region in the n-type well 9. The impurity concentration of region 201 has a value that is desirable to the base diffusion region.

Figure 3D:
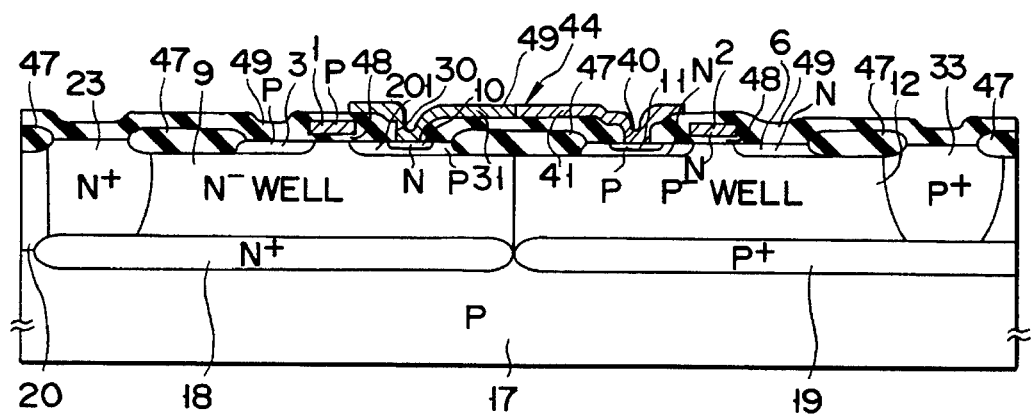
Figure 3E:
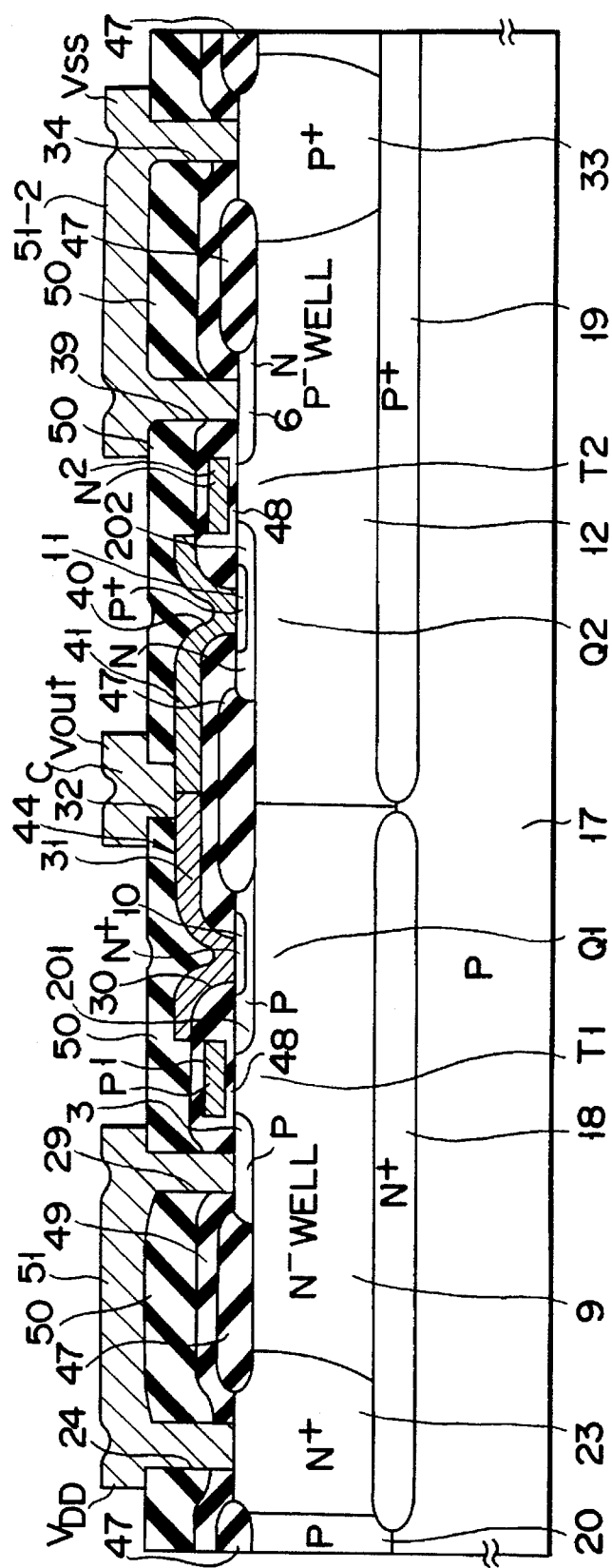
Figure 4:
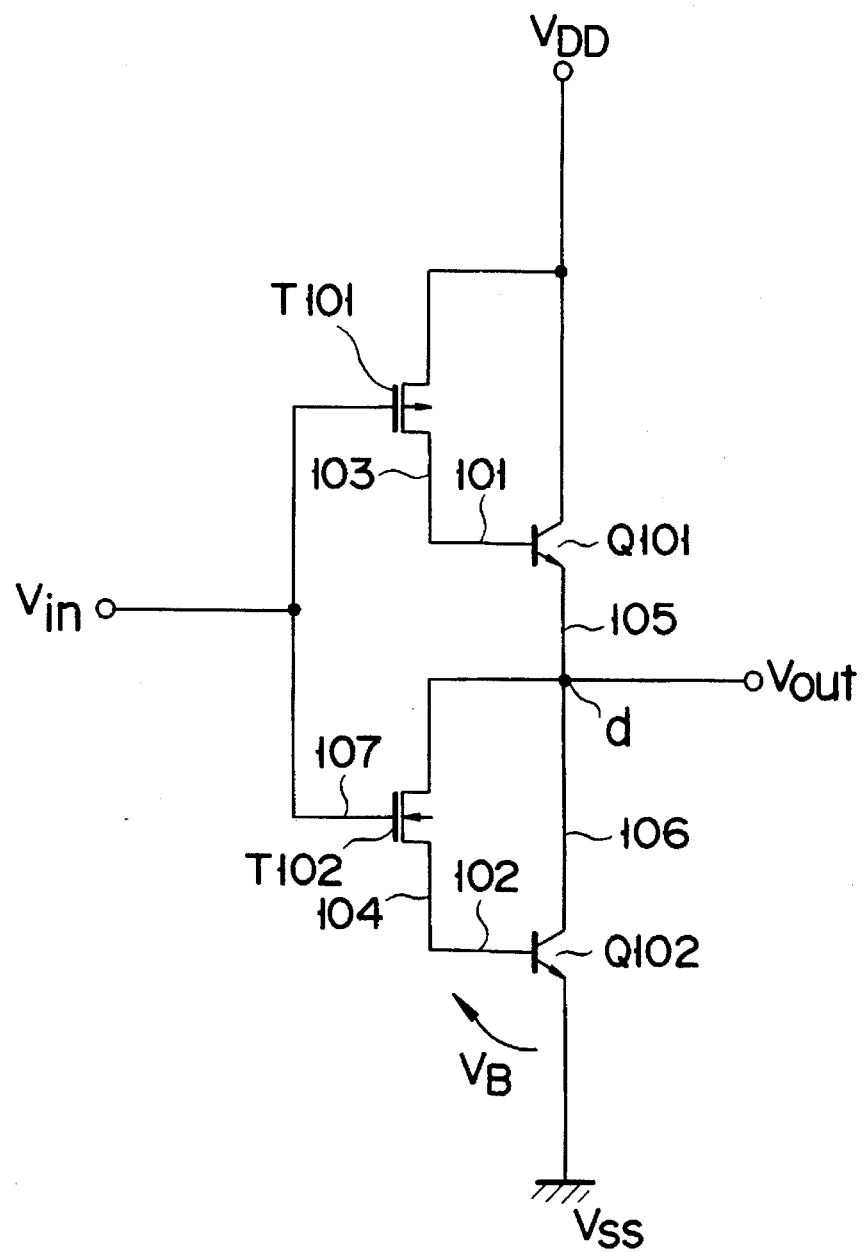
FIG. 4 is a circuit diagram of circuit not incorporating the present invention.

Next, as shown in FIG. 3D, an insulation film 49 such as an oxide film is formed over the entire surface by means of, for example, CVD. Next, contact holes 30 and 40 are formed in those parts of insulating film 49 which correspond to predetermined emitter forming regions within n– well region 9 and p– well region 12 by means of, for example, photoetching method using photoresist. Ions of, for example, arsenic (As) are implanted into the npn bipolar transistor forming region within n– well region 9 and thermally diffused into p-type semiconductor layer 201 (solid phase diffusion from polysilicon), thereby to form a highly doped n+ emitter diffusion region 10. Next, ions of, for example, boron (B) or boron fluoride (FB$_2$) are implanted into the pnp bipolar transistor forming region within p-well region 12 and thermal diffused into n-type semiconductor layer 202 (solid phase diffusion from polysilicon), thereby to form a highly doped p+ emitter diffusion region 11. It is desirable that the thermal diffusion steps for emitter diffusion regions 10 and 11 should be performed simultaneously if possible.

At least one of emitter diffusion regions 10 and 11 may be formed directly by ion implantation and thermal diffusion instead of the diffusion from the polysilicon.

As the conductive material, metal, polycide or silicide may be used instead of polysilicon. MBE (Molecular Beam Epitaxy) may be used. In the case of metal, particularly aluminum, ion implantation should be made to drain/base diffusion region 201, 202 directly in forming emitter diffusion regions 10 and 11. Of course, both of the pnp and npn transistors or one of them may use aluminum.

Next, by means of photoetching method using photoresist, patterning is made on the polysilicon to form common emitter electrode 44. Common emitter electrode 44 is implanted with n– impurities about over n-well region 9 and with p-type impurities about over p-well region 12 as described above.

Next, an insulating film 50 such as a BPSG film is deposited over the entire surface by means of, for example, CVD and then flattened. Collector contact holes 24 and 34, source contact holes 29 and 39, an emitter contact hole 32 and a gate contact hole which is shown in FIG. 2 though not shown in FIGS. 3A through 3E are formed in the insulating film by means of, for example, photoetching method using photoresist. Next, a metal material, usually aluminum (Al), is deposited over the entire surface by means of, for example, sputtering, and then patterned to form the circuit connections shown in FIG. 1. The VDD power supply metal line is connected to electrode 51. The Vout metal line is connected to electrode C. The ground metal line is connected to electrode 51-2. The electrode (gate electrode) to which the Vin metal line is connected is not shown.

In forming p+ and n+ buried diffusion layers 18 and 19, one of them, for example, the p+ buried diffusion layer may be formed after the formation of epitaxial layer 20. The effect is to prevent deteriorating of precise due to the thermal process for the p+ buried diffusion layer. As an example, the p+ buried diffusion layer may be formed after the formation of element isolation region 47. After the formation of a thick mask material, ions of boron (B) are implanted into a predetermined region. At this point, an ion acceleration voltage is selected so that a predetermined depth is reached. In general, when the depth is 1.5 μm, an acceleration voltage on the order of MeV is required. The ion-implanted region is activated by the subsequent thermal process. In the case of the n+ buried diffusion layer, phosphorous (P) or arsenic (As) should be used.

By such a manufacturing method, a layout-improved inverter gate circuit according to an embodiment of the present invention can be manufactured.

With the embodiment described above, npn and pnp bipolar transistors are formed of vertical bipolar transistors. Alternatively, one of them may be formed of a lateral bipolar transistor. Common emitter electrode 44 is formed to extend across emitter 10 of the npn bipolar transistor and emitter 11 of the pnp bipolar transistor. Such a common emitter electrode helps to reduce the number of contact holes 32 and to connect n+ emitter electrode 31 and p+ emitter electrode 41 together. Alternatively, a separate contact hole and emitter electrode may be provided for each of n+ emitter electrode 31 and p+ emitter electrode 41.

This approach may also be applied to the gate electrode. That is, a separate contact hole and gate electrode may be provided for each of gate electrode 1 of the n-channel MOSFET and gate electrode 2 of the p-channel MOSFET.

Furthermore, with respect to electrode 51 formed to extend across collector 23 of the npn bipolar transistor and source 3 of the p-channel MOSFET, a separate collector electrode may be provided. Similarly, with respect to electrode 51-2 formed to extend across emitter 33 of the pnp bipolar transistor and source 6 of the n-channel MOSFET, a separate emitter electrode may be provided.

FIG. 5 is a circuit diagram of a NAND circuit according to another embodiment of the present invention.

In FIG. 5, a p-type MOSFET T3 is connected in parallel with T1 of the inverter gate circuit of FIG. 1 and an n-type MOSFET T4 is connected in series with T2. D is the other input terminal of the NAND circuit. Thereby, the NAND logical operation becomes feasible.

Transistor T3 is formed within the same well as transistors T1 and Q1. Transistor T4 is formed within the same well as transistors T2 and Q2. This permits miniaturization of the device as is the case with the embodiment of FIG. 1.

The LDD structure of transistors T3 and T4 is the same as that of transistors T1 and T2 of FIG. 1. Similarly, the device reliability is enhanced through the improvement in the withstanding voltage property between the gate and drain.

As described above, according to the present invention, the problem of an increase in the number of device isolation regions resulting from the need of electrical isolation of the collector of the load driving bipolar transistor can be solved. This can provide a semiconductor integrated circuit which is small in size and fast in operation. Furthermore, the operating margin at a low supply voltage is also improved because the inverter gate circuit is of a grounded source type. Because the base of a bipolar transistor and the drain of a MOSFET are formed within the same diffusion region, both the pnp and npn bipolar transistors can be made very small and the number of contacts can be decreased.

Moreover, the drain of a MOSFET is made lower in impurity concentration than the source. This LDD structure avoids localized concentration of electric field, making the occurrence of avalanche phenomenon difficult.

Thereby, the withstanding voltage property between gate and drain is improved and the reliability of the device is enhanced. Therefore, a semiconductor integrated circuit which is smaller in size, faster in operation, highly reliable and good in manufacturing yield and a method of manufacture therefor can be provided.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. An inverter semiconductor device comprising:

a positive power source for providing power to said semiconductor device;

a ground;

an input terminal for inputting an input signal;

an output terminal for outputting an inverted input signal;

a p-channel MOSFET having a first source connected to said positive power source, a first gate connected to said input terminal, and a first drain;

an npn bipolar transistor having a first collector connected to said first source, a first base connected to said first drain, and a first emitter connected to said output terminal, said first drain and said first base being formed within one first region defined within the semiconductor device, said first source having a higher impurity concentration than that of said first drain, and the impurity concentration of the first drain and first base being determined in accordance with the characteristics of the npn bipolar transistors;

an n-channel MOSFET having a second drain, a second gate connected to said input terminal, and a second source; and a pnp bipolar transistor having a second emitter connected to both said output terminal and said first emitter, a second base connected to said second drain, and a second collector connected to said ground, said second drain and said second base being formed within one second region defined within the semiconductor device, said second source having a higher impurity concentration than that of said second drain, and the impurity concentration of the second drain and second base being determined in accordance with the characteristics of the pnp bipolar transistors, wherein the impurity concentration of the first and second drains is substantially within a range of $10^{18}$ to $10^{19}$ cm$^{-3}$, and the impurity concentration of the first and second sources is substantially $10^{20}$ cm$^{-3}$.

* * * * *